(12) United States Patent
Ogashiwa et al.

(10) Patent No.: US 8,912,088 B2
(45) Date of Patent: Dec. 16, 2014

(54) TRANSFER SUBSTRATE FOR FORMING METAL WIRING AND METHOD FOR FORMING METAL WIRING USING SAID TRANSFER SUBSTRATE

(75) Inventors: Toshinori Ogashiwa, Kanagawa (JP); Masaaki Kurita, Kanagawa (JP); Takashi Nishimori, Kanagawa (JP); Yukio Kanehira, Kanagawa (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 13/879,803

(22) PCT Filed: Nov. 18, 2011

(86) PCT No.: PCT/JP2011/076628
§ 371 (c)(1),
(2), (4) Date: Apr. 16, 2013

(87) PCT Pub. No.: WO2012/070480
PCT Pub. Date: May 31, 2012

(65) Prior Publication Data
US 2013/0196504 A1     Aug. 1, 2013

(30) Foreign Application Priority Data

Nov. 26, 2010   (JP) .................................. 2010-263135

(51) Int. Cl.
*H01L 21/44*        (2006.01)
*H01L 21/48*        (2006.01)
*H01L 23/00*        (2006.01)
*B23K 35/30*        (2006.01)
*B23K 35/32*        (2006.01)
*B23K 35/02*        (2006.01)
*B81C 1/00*         (2006.01)
*B22F 7/08*         (2006.01)
*B23K 1/00*         (2006.01)

(52) U.S. Cl.
CPC ............ *H01L 21/4885* (2013.01); *H01L 24/11* (2013.01); *B23K 35/3006* (2013.01); *B23K 35/3013* (2013.01); *B23K 35/322* (2013.01); *B23K 35/0244* (2013.01); *B81C 1/00095* (2013.01); *B81C 1/00373* (2013.01); *B22F 7/08* (2013.01); *H01L 24/03* (2013.01); *B23K 1/0016* (2013.01); *B23K 2201/40* (2013.01); *H01L 24/05* (2013.01); *H01L 24/13* (2013.01); *H01L 2224/0401* (2013.01); *H01L 2224/05082* (2013.01); *H01L 2224/05166* (2013.01); *H01L 2224/05169* (2013.01); *H01L 2224/111* (2013.01); *H01L 2224/11334* (2013.01); *H01L 2224/13139* (2013.01); *H01L 2224/13144* (2013.01); *H01L 2924/01047* (2013.01); *H01L 2924/01006* (2013.01); *H01L 2924/01024* (2013.01); *H01L 2924/01033* (2013.01); *H01L 2924/0104* (2013.01); *H01L 2924/01044* (2013.01); *H01L 2924/01045* (2013.01); *H01L 2924/01073* (2013.01); *H01L 2924/01074* (2013.01); *H01L 2924/01077* (2013.01); *H01L 2924/01078* (2013.01); *H01L 2924/01079* (2013.01); *B81C 2201/0188* (2013.01); *B81C 2201/0194* (2013.01); *H01L 2924/01029* (2013.01); *H01L 2224/03334* (2013.01); *H01L 2224/03003* (2013.01); *H01L 2224/031* (2013.01); *H01L 2224/0312* (2013.01); *H01L 2224/0508* (2013.01); *H01L 2224/05083* (2013.01); *H01L 2224/05144* (2013.01); *H01L 2224/05639* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/0567* (2013.01); *H01L 2224/05671* (2013.01); *H01L 2224/05673* (2013.01); *H01L 2224/05676* (2013.01); *H01L 2224/05678* (2013.01); *H01L 2224/05681* (2013.01); *H01L 2224/05684* (2013.01); *H01L 2224/11003* (2013.01); *H01L 2224/13147* (2013.01); *H01L 2224/13164* (2013.01); *H01L 2224/13169* (2013.01); *H01L 2224/1112* (2013.01)

USPC .......... 438/616; 257/E21.508; 257/E21.513; 257/E21.515; 257/E21.519; 438/598; 438/612; 438/618

(58) Field of Classification Search
USPC ............... 257/E21.508, E21.513, E21.515, 257/E21.519; 438/598, 612, 616, 618
See application file for complete search history.

(56) References Cited

U.S. PATENT DOCUMENTS

| | | | | |
|---|---|---|---|---|
| 2001/0023779 | A1* | 9/2001 | Sugaya et al. ............... | 174/255 |
| 2006/0163744 | A1* | 7/2006 | Vanheusden et al. ......... | 257/773 |

FOREIGN PATENT DOCUMENTS

| | | |
|---|---|---|
| JP | 05-144870 | 6/1993 |
| JP | 06-267963 | 9/1994 |
| JP | 2006-260954 | 9/2006 |

*Primary Examiner* — Asok K Sarkar
(74) *Attorney, Agent, or Firm* — Roberts & Roberts, LLP

(57) ABSTRACT

The present invention provides a transfer substrate for transferring a metal wiring material to a transfer-receiving object, the transfer substrate comprising a substrate, at least one metal wiring material formed on the substrate and an underlying metal film formed between the substrate and the metal wiring material, wherein the metal wiring material is a molded article prepared by sintering, e.g., gold powder having a purity of 99.9% by weight or more and an average particle size of 0.01 μm to 1.0 μm and the underlying metal film is composed of a metal such as gold or an alloy. The transfer substrate is capable of transferring a metal wiring material to the transfer-receiving object even at a temperature for heating the transfer-receiving object of 80 to 300° C.

12 Claims, 2 Drawing Sheets

TRANSFER SUBSTRATE FOR FORMING METAL WIRING AND METHOD FOR FORMING METAL WIRING USING SAID TRANSFER SUBSTRATE

TECHNICAL FIELD

The present invention relates to a transfer substrate for forming a metal wiring on a transfer-receiving object such as a semiconductor wafer, a compound wafer or an MEMS wafer, and a method of forming a metal wiring using the same.

BACKGROUND ART

With the increase in packaging density of electronic parts such as semiconductor chips, the mainstream of the packaging method has shifted from conventional wire bonding methods to wireless mounting methods such as flip-chip bonding methods in which a semiconductor chip is directly mounted to a circuit substrate. In the process of producing an electronic part using this mounting method, a bump is formed on a terminal electrode on a semiconductor chip on a device wafer or an external electrode for connecting to a semiconductor chip, thereby forming a metal wiring, and face down bonding the same to a substrate. Also it is common that before forming a bump, the terminal electrode is metallized to form a barrier metal layer and a bump is formed thereon.

In conventional methods of forming a bump, plating methods have been generally used. Bumps formed by a plating method are considered to be useful as an electrode because they are compact and have good electric conductivity. However, there is a concern that the formation of bumps by a plating method is insufficient for responding to miniaturization of metal wiring that is considered to develop further in the future. Thus, a method of forming a bump based on a transfer method using a transfer substrate has been proposed as in Patent Literature 1.

In the method of forming a bump with a transfer substrate, a transfer substrate in which a wiring material that will serve as a bump is previously formed on a substrate such as glass is prepared. Then the transfer substrate is put on a wafer previously metallized and the resultant is pressed and heated, thereby transferring the wiring material to the wafer to form a bump. The method can transfer any wiring material on a transfer substrate to any position of a wafer by controlling pressing and heating, and therefore enables miniaturization of metal wiring, and in addition can avoid forming wiring on a defective sector of the wafer, and can even avoid wasting resources.

PRIOR ART DOCUMENTS

Patent Document

[Patent Document 1] Japanese Patent Application Laid-Open No. 5-144870

In the meantime, in the above process of forming a bump using a transfer substrate, the heating temperature at the wafer side is slightly different from the heating temperature at the transfer substrate side at the time of transfer of the bump from the transfer substrate to the wafer. More specifically, the heating temperature at the wafer side is 300 to 400° C., while the heating temperature at the transfer substrate side is 100 to 200° C. The setting temperatures and the difference in the temperatures cause deformation (warpage) of the transfer substrate. In other words, as glass is often used as a transfer substrate, the glass is likely to be deformed when the heating temperature is 200° C. or more. In this case, even if the heating temperature for the transfer substrate is set at a relatively low temperature, the temperature of the glass substrate is likely to increase due to the transfer of heat through the bump if a high heating temperature is employed at the wafer side.

Also, in the case where a semiconductor circuit is formed on a wafer, the high temperature at the wafer side for the transfer of a bump may cause damage on the circuit. For these reasons, generally a low heating temperature is more preferred at the time of the transfer of a bump, but the heating temperature at the wafer side should not be easily lowered. This is because a bump is usually formed on a transfer substrate by a plating method and in order to transfer the bump formed by plating to a wafer, it is necessary to bond the wafer and the bump sufficiently, and this necessitates high temperature heating.

SUMMARY OF THE INVENTION

Problems to be Solved by the Invention

Thus, the present invention provides a transfer substrate for forming a metal wiring on a transfer-receiving object such as wafer by a transfer method, the transfer substrate allowing the heating temperature at the side of the transfer-receiving object to be lower than before. A method of forming a metal wiring using the transfer substrate is also disclosed.

Means for Solving the Problems

To solve the above problem, the present inventors have conducted studies based on our technical knowledge for discovering a transfer substrate which is provided with a metal wiring material and which has a structure that enables transfer to a transfer-receiving object at a low temperature. As a result, the present inventors have found that a molded article prepared by sintering high purity and fine particle size metal powder can be bonded to a transfer-receiving object at a relatively low temperature, and the molded article functions as a metal wiring, and have completed the present invention.

Accordingly, the present invention is a transfer substrate for transferring a metal wiring material to a transfer-receiving object, the transfer substrate comprising a substrate, at least one metal wiring material formed on the substrate and an underlying metal film formed between the substrate and the metal wiring material, wherein the metal wiring material is a molded article prepared by sintering at least one metal powder having a purity of 99.9% by weight or more and an average particle size of 0.01 μm to 1.0 μm, selected from gold powder, silver powder, platinum powder, palladium powder and copper powder, and the underlying metal film is composed of any metal of gold, silver, platinum, palladium, ruthenium, rhodium, iridium, chromium, titanium, tungsten, tantalum, nickel, copper and zirconium, or an alloy thereof.

In the following, the present invention will be described in detail. As described above, the transfer substrate of the present invention is characterized in that as a metal wiring material (bump) to be transferred to a transfer-receiving object (wafer), a sintered body prepared by sintering a predetermined metal powder is employed. The metal wiring material composed of the sintered body is porous and different from a compact body formed by conventional plating, and has a point contact with the surface of a transfer-receiving object at the time of transfer. The present inventors consider that the point contact obtained by the porous state allows the temperature necessary for bonding to the surface of the transfer-receiving object to be low. As a result, the temperature at the side of the transfer-receiving object at the time of transfer can be lower (at 300° C. or lower) than before.

For the metal wiring material composed of a sintered body, the reasons the purity and the particle size of the metal powder to be sintered are specified are as follows. For the purity, in consideration of conductivity after being formed into a bump and transferred. More specifically, when the purity is less than 99.9% by weight, necessary conductivity might not be obtained. Also, for the particle size of the metal powder, in the case of a metal powder having a particle size of more than 1.0 μm, large voids may be easily formed in the molded article and consequently necessary conductivity cannot be obtained. The better the smaller the particle size of the metal powder, but since handling of powder having a particle size of less than 0.01 μm is inefficient, the lower limit of the particle size is 0.01 μm.

The metal wiring material composed of a sintered body is porous and has a density of preferably 0.45 to 0.95 times the density of the original metal powder. As the sintering progresses, the metal wiring material becomes compact and obtains a density close to that of the bulk metal. A metal wiring material having a density of more than 0.95 times the density of the bulk metal is too hard for transfer to be carried out. On the other hand, a metal wiring material having a density of less than 0.45 times that of the bulk metal is not preferred as metal wiring because metal powder particles do not have sufficient contact and thus have poor conductivity.

The metal wiring material is composed of gold powder, silver powder, platinum powder, palladium powder, copper powder or an alloy powder of these metals. This is because the conductivity of the bump is considered. The metal wiring material may be prepared by sintering only one of the above metal powders, or a mixture of two or more of them. For example, gold powder alone may be sintered, or gold powder and palladium powder may be mixed, or gold powder and silver powder may be mixed and then sintered.

The above metal wiring material is not directly formed on a substrate, and an underlying metal film is formed between the substrate and the metal wiring material. Although glass substrates are often used as the substrate, since glass has poor bonding properties to metal, direct formation of a metal wiring material on glass is likely to cause detachment at the time of handling of the transfer substrate. For this reason, an underlying metal film is formed to ensure adhesiveness to the metal wiring material. The underlying metal film is composed of any metal of gold, silver, platinum, palladium, ruthenium, rhodium, iridium, chromium, titanium, tungsten, tantalum, nickel, copper and zirconium, or an alloy thereof.

In the transfer substrate of the present invention, at least one coating layer composed of a predetermined metal may be formed on the surface of the metal wiring material (facing the transfer-receiving object). As described above, in the process of producing an electronic part by a wireless mounting method, often a terminal electrode on wafer is metallized before forming a bump to form a barrier metal layer and a bump is formed thereon. Thus, in the present invention, a coating layer is previously formed on a metal wiring material which will serve as a bump, and transfer is carried out in this state so that a barrier metal layer and a bump can be simultaneously formed. While even a metallizing treatment for forming a barrier layer is a load for a semiconductor circuit, forming a coating layer eliminate the need for the metallizing treatment of wafer and thus can reduce the load. The use of the coating layer also contributes to simplification of the process for forming a bump.

As described above, the metal wiring material can be transferred even if a coating layer has been formed, because as long as the coating layer has a predetermined thickness, the above-described easiness of bonding by point contact on the surface of the sintered body can be maintained. Herein, to maintain the surface state of the sintered body, the coating layer needs to have a thickness of 1 μm or less. The thinner the coating layer, the better, but when the coating layer is extremely thin, the continuity of the metal layer is difficult to be obtained. Therefore the lower limit of the thickness of the coating layer is preferably 0.003 μm.

The coating layer is composed of any metal of gold, silver, platinum, palladium, ruthenium, rhodium, iridium, chromium, titanium, tungsten, tantalum, nickel, copper and zirconium, or an alloy thereof, which is different from the metal wiring material. Also it is preferable that the coating layer has a compact and thin film structure. Regardless of the type of the coating layer, the layer may have a thickness of 1 μm or less. The coating layer may be a single layer or may have a multi-layer structure of a plurality of metals, and may have a total thickness of 1 μm or less.

The underlying metal film may have the same composition as the metal wiring material, and more preferably has a composition different from that of the metal wiring material. When the composition is the same as that of the metal wiring material, the adhesiveness between the metal wiring material and the underlying metal film may be increased, and thus the metal wiring material may remain on the substrate at the time of transfer to the transfer-receiving object. However, even the underlying metal film and the metal wiring material are composed of the same composition, the heating condition in transfer, for example, is adjusted so as to increase the adhesiveness between the metal wiring material and the transfer-receiving object, and thus remaining of the metal wiring material can be avoided. Therefore, the compositions need not always be different.

It is preferable that the underlying metal film has a thickness of 1 to 100 nm. A thickness of less than 1 nm causes low adhesiveness between the underlying metal film and the substrate, and the adhesiveness of the metal wiring material cannot be obtained. Although the upper limit is not particularly limited, a thickness of more than 100 nm does not make difference in the effect. By adjusting the thickness of the underlying metal film in the above range, the transfer rate of the metal wiring material can be adjusted. More specifically, when the underlying metal film and the metal wiring material are composed of the same material (for example, Au is used for the underlying metal film on the glass substrate and Au powder is used for the metal wiring material), the adhesiveness between the underlying metal film and the metal wiring material is increased, and therefore by reducing the thickness of the underlying metal film, the underlying metal film can be separated from the substrate at the time of transfer. This method of separating at the time of transfer by the thinning of the underlying metal film can suppress residues of the metal wiring material and thus is more effective in adjusting the transfer rate compared to the case of increasing the thickness of the underlying metal film. When the thickness of the underlying metal film is reduced with the intention of separating at the time of transfer as herein described, the underlying metal film has a thickness of preferably ⅓ or less of the average particle size of metal powder constituting the metal wiring material.

The underlying metal film may be composed of a single layer or a plurality of layers. For example, a titanium film may be formed on a glass substrate and then a gold film may be formed thereon. Such multilayer films may be heated to allow titanium to diffuse into the outermost surface and be oxidized to form oxide.

Since Cr, W and TiW are susceptible to oxidation, when using them as a single layer, the surface may be subjected to an oxygen plasma treatment to stabilize the surface oxide film. The oxygen plasma treatment means plasma treatment in ozone or oxygen atmosphere in atmospheric or reduced pressure.

A common material of a substrate on which a metal wiring material is formed is glass or resin-reinforced glass, and silicon and metal such as Kovar may also be employed. Although the thickness of the substrate is not particularly limited, the substrate has a thickness of preferably 50 to 500 µm in consideration of its handling ability and stability of transfer.

The process for producing the transfer substrate of the present invention includes forming an underlying metal film on a substrate such as glass and then forming a metal wiring material. For forming the underlying metal film, various thin film forming processes such as a sputtering method, a plating method and a CVD method, may be employed.

On the other hand, for the formation of the metal wiring material, the metal wiring material is formed by sintering metal powder in the present invention as described above. It is preferable that for forming the metal wiring material composed of metal powder, a metal paste prepared by adding an appropriate organic solvent to metal powder is used for molding. This is because the paste can be applied by a wide variety of methods and is also available for miniaturization of wiring as described later.

Preferred examples of organic solvents for the metal paste include ester alcohol, terpineol, pine oil, butyl carbitol acetate, butyl carbitol and carbitol. Preferred examples of ester alcohol organic solvents include 2,2,4-trimethyl-3-hydroxypentaisobutyrate ($C_{12}H_{24}O_3$). This solvent is preferred because it can be dried at a relatively low temperature.

The metal paste may contain at least one resin selected from an acrylic resin, a cellulose resin and an alkyd resin in addition to the above organic solvent. The addition of such resin prevents the metal powder in the metal paste from coagulating and makes the metal paste more homogeneous, and therefore a uniform bump can be formed. Examples of acrylic resin include methyl methacrylate polymer, examples of cellulose resin include ethyl cellulose, and examples of alkyd resin include phthalic anhydride resin. Of them, ethyl cellulose is particularly preferred.

The step of applying the metal paste is not particularly limited. For example, a mold of a bump shape may be placed on a substrate and the mold may be filled with the metal paste. Alternatively, as in the case of forming a bump by a conventional plating method, a resist may be used. As the method of applying the metal paste, various methods may be used, such as a spin coating method, a screen printing method, an ink jet method and a method comprising spreading dropped paste by a silicon rubber spatula, thereby filling pores with the paste.

After applying the metal paste, it is necessary to sinter the paste after applying and drying the metal paste. This will create a close point contact state between metal particles in the paste and between the bonding surface of a bonding member (the surface to which the paste is applied) and metal particles, and thus the shape of the metal wiring material is settled. It is preferable that the temperature of sintering is 80 to 300° C. This is because when the temperature is less than 80° C., no point contact is formed. On the other hand, at more than 300° C. sintering progresses excessively and necking between metal particles develops to cause strong bonding, making the resultant too hard. Also, heating at more than 300° C. may cause deformation of glass substrates. The heating time for sintering is preferably 30 to 120 minutes. This is because when the heating time is short, the temperature in the sintering furnace is unstable and therefore the metal powder cannot be sufficiently sintered. This is also because when the heating time is too long, productivity is lowered. Also it is preferable to carry out sintering without applying pressure.

In the case of forming a coating layer on the metal wiring material, various thin film forming processes such as a sputtering method, a plating method and a CVD method, may be employed as in the case of forming underlying metal.

Next, the method of forming a metal wiring on a transfer-receiving object with the transfer substrate according to the present invention is basically the same as that in a conventional transfer method. More specifically, a transfer substrate is superimposed on a transfer-receiving object (wafer) with the surface of the transfer substrate on which a metal wiring material is formed being opposed to the transfer-receiving object, and while the transfer substrate and the transfer-receiving object are heated, the metal wiring material is pressed against the transfer-receiving object to bond the metal wiring material to the transfer-receiving object, and then the transfer substrate is removed. In this method, the temperature for heating the transfer substrate is 80 to 200° C. and the temperature for heating the transfer-receiving object is 80 to 300° C. in the present invention.

In the present invention, the temperature for heating the transfer-receiving object may be 80 to 300° C., which is lower than that in a transfer process with a conventional transfer substrate. The temperature for heating the transfer-receiving object is preferably 100 to 200° C. This is for reliable transfer of a metal wiring material from a transfer substrate and for effective prevention of overheating due to heat transfer from the transfer-receiving object to the transfer substrate. The temperature for heating the transfer substrate is preferably 100 to 200° C.

Also, in this transfer method, to press a metal wiring material against the transfer-receiving object, namely, pressurization, is essential. It is preferable that the pressure is equal to or less than the yield strength of the metal wiring material. This is because pressurization far exceeding the yield strength causes deformation of the metal wiring material and thus the predetermined height or shape cannot be obtained. Specifically the pressure is preferably 0.1 to 1.5 times the yield strength of the metal wiring material.

It is preferable that an electrode film composed of a metal containing a metal constituting the metal wiring material on the transfer substrate is previously formed on the transfer-receiving object at a position where metal wiring is to be formed. This is for reliable transfer of metal wiring material. The composition, however, may not be exactly the same. For example, when the metal wiring material is composed of a mixture of gold powder and silver powder, the electrode film formed on the transfer-receiving object may be composed of gold. The electrode film may be composed of a single layer or a plurality of layers as long as the outermost layer is composed of metal of the same type as the metal wiring material.

Advantages Effect of the Invention

As described above, the transfer substrate of the present invention ensures stable transfer of a metal wiring material even when the temperature for heating a transfer-receiving object is low at the time of transfer. As a result, deformation of transfer substrates due to overheating can be prevented and damage on the transfer-receiving object can be prevented.

First Embodiment

A transfer substrate was prepared by using a glass substrate and a metal wiring was formed on a Si wafer by using the transfer substrate.
(Preparation of Transfer Substrate)

First a Pt film was formed on a glass substrate (diameter size 100 mm, 4 inches, average thickness 500 μm) by sputtering as an underlying metal film. For the formation of the Pt film, after cleaning the glass substrate by reverse sputtering (Ar pressure: $2.8 \times 10^{-1}$ Pa, RF output: 250 W, sputtering time: 60 seconds), a Pt film having a thickness of 20 nm was formed by using a Pt target in the condition of an Ar pressure of $7.0 \times 10^{-1}$ Pa, a DC output of 500 W and a sputtering time of 115 seconds.

Next, by using a metal paste composed of Au powder, a metal wiring material was formed on the glass substrate. The metal paste used here was prepared by mixing gold powder having a purity of 99.95% by weight (average particle size: 0.3 μm) produced by a wet reduction method and ester alcohol (2,2,4-trimethyl-3-hydroxypentaisobutyrate ($C_{12}H_{24}O_3$)) as an organic solvent. For forming the metal wiring material, photoresist was applied to the glass substrate and through-holes were formed by using usual photolithography. Then the metal paste was dropped on the surface of the photoresist and the through-holes in the photoresist were filled with the gold paste by a spin coating method. Next the substrate to which the paste was applied was dried in a dryer kept at a temperature of 50° C. or less, and then the resist was removed with an organic solvent. After removing the resist, the substrate was put in an electric furnace to sinter the gold powder, thereby forming a metal wiring material. The sintering was carried out at a temperature of 90° C. for 1 hour. In this embodiment, 100 rectangular metal wiring materials (diameter dimension 50 μM, height 25 μm) were formed on the substrate at regular intervals.
(Transfer to Wafer)

Figure 1:
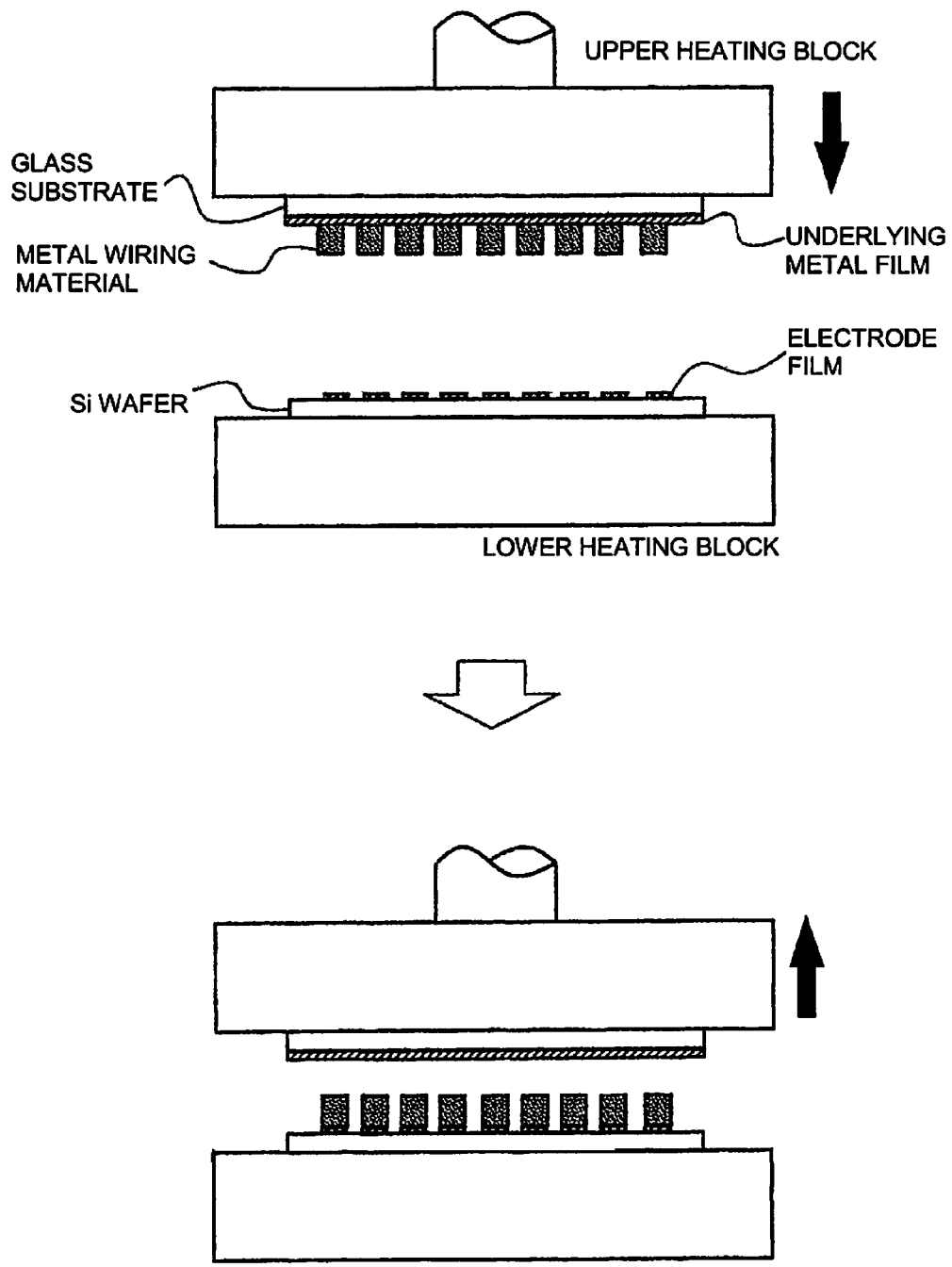
FIG. 1 is a schematic view illustrating the process for forming a metal wiring according to the first embodiment.

Wiring was formed on a Si wafer by use of the transfer substrate prepared above. FIG. 1 is a view illustrating the process. As FIG. 1 shows, the glass substrate for transfer prepared in this embodiment is set on an upper heating block by adsorption and a Si wafer (size 100 mm, 4 inches) on which wiring is to be formed is set on a lower heating block. Ti/Pt/Au (thickness 50 nm/50 nm/200 nm) is formed on the surface of the Si wafer as an electrode film. After setting the transfer substrate and the Si wafer, the upper heating block is lowered to allow the transfer substrate to adhere to the Si wafer. The upper heating block was heated at 150° C. and the lower heating block was heated at 150° C., and the upper heating block was pressed at a pressure of 30 MPa and the state of pressing was maintained for 10 minutes. After some time, the upper heating block was raised. The pressure at this stage was set at 1.4 times the yield strength (21 MPa) of a gold powder sintered body that had been previously measured at 150° C. or less.

After the upper heating block was lifted up, whether any metal wiring material remained on the transfer substrate or not was observed, and it has been found that all metal wiring materials were transferred to the Si wafer to form metal wirings without transfer leftovers. Also, the height of each transferred metal wiring was measured to examine irregularity. As a result, the irregularity was within ±0.5 μm, showing that the metal wirings also had a good shape.

Second Embodiment

In this embodiment, transfer substrates were prepared while changing the configuration of the metal powder (metal paste) constituting the metal wiring material on the transfer substrate and the underlying metal film, and a metal wiring was formed on a Si wafer by using the respective transfer substrates. The structure of the transfer substrates prepared in this embodiment is as follows. Condition for preparing the transfer substrates are the same as those in the first embodiment except for the types of metal powder and the target materials for forming underlying metal (in the case of an underlying metal film composed of an alloy, an alloy target having the same composition was used).

TABLE 1

| | Metal wiring material | | Underlying metal film | |
|---|---|---|---|---|
| No. | Metal powder | Average particle size (μm) | Material | Film thickness (nm) |
| 1 | Au | 0.01 | Pt | 1 |
| 2 | | 0.3 | | 20 |
| 3 | | 1 | | 100 |
| 4 | Ag | 0.3 | Pt | 20 |
| 5 | Pd | | | |
| 6 | Pt | | Au | 20 |
| 7 | Au | 0.3 | Au | 20 |
| 8 | | | Ti | |
| 9 | | | Ru | |
| 10 | | | Pd | |
| 11 | | | Cr | |
| 12 | | | Ta | |
| 13 | | | Ir | |
| 14 | | | Au/Cr | |
| 15 | | | Au/Ti | |
| 16 | | | Pt—0.1% Zr | |
| 17 | | | Au—0.1% Zr | |
| 18 | | | Pt | |
| 19 | | 1.2 | Pt | |

All substrates were glass substrates

Sample No. 2 is the same as the first embodiment

For Samples Nos. 14 and 15, a multilayer film (Au/Cr, Au/Ti) was formed and then heated at 250° C. in air for 1 hour to diffuse Cr or Ti into the Au surface and the surface was oxidized in air.

For Pt—0.1% Zr and Au—0.1% Zr, a single layer film was formed by use of an alloy target A metal wiring was formed on a Si wafer by using the respective transfer substrates above. In these tests, the metal film on the Si wafer was changed in some cases. Also the temperature for heating the lower block was changed in some cases. The results of the tests are shown in Table 2.

TABLE 2

| Test No. | Transfer substrate Wiring No. | Transfer substrate Wiring material | Transfer substrate Underlying metal film | Si wafer Outermost surface of electrode film | Transfer conditions Wafer heating temperature | Transfer conditions Pressure | Results of transfer test Transfer rate | Results of transfer test Variation |
|---|---|---|---|---|---|---|---|---|
| 1 | 1 | Au | Pt | Au | 80 | 1.5 | 100/100 | ±0.5 |
| 2 | 2 | | | | 150 | 1.0 | 100/100 | ±0.5 |
| 3 | 3 | | | | 300 | 0.1 | 100/100 | ±0.5 |
| 4 | 4 | Ag | Pt | Ag | 150 | 1.0 | 100/100 | ±0.5 |
| 5 | 5 | Pd | Pt | Pd | 250 | 1.0 | 100/100 | ±0.5 |
| 6 | 6 | Pt | Au | Pt | 250 | 1.0 | 100/100 | ±0.5 |
| 7 | 7 | Au | Au | Au | 150 | 1.0 | 100/100 | ±0.5 |
| 8 | 8 | | Ti | | | | 100/100 | ±0.5 |
| 9 | 9 | | Ru | | | | 100/100 | ±0.5 |
| 10 | 10 | | Pd | | | | 100/100 | ±0.5 |
| 11 | 11 | | Cr | | | | 100/100 | ±0.5 |
| 12 | 12 | | Ta | | | | 100/100 | ±0.5 |
| 13 | 13 | | Ir | | | | 100/100 | ±0.5 |
| 14 | 14 | | Au/Cr | | | | 100/100 | ±0.5 |
| 15 | 15 | | Au/Ti | | | | 100/100 | ±0.5 |
| 16 | 16 | | Pt—0.1% Zr | | | | 100/100 | ±0.5 |
| 17 | 17 | | Au—0.1% Zr | | | | 100/100 | ±0.5 |
| 18 | 1 | Au | Pt | Au | 70 | 1.5 | 80/100 | ±0.5 μm or more |
| 19 | 19 | Au | Pt | Au | 300 | 1.5 | 90/100 | ±0.5 μm or more |

The temperature for heating the transfer substrate was 150° C.
The pressure represents (pressure for transfer substrate/yield stress of metal wiring material).

Table 2 above shows that both when the metal wiring material was composed of varying types of metal powder and when the underlying metal film was changed, the transfer was perfect even at a low temperature of 300° C. or less. However, although low temperature is applicable, the transfer rate is likely to be decreased when the heating temperature at the wafer side is low (Test No. 18). Also, it has been found that when a metal powder having a large particle size was used (Test No. 19), the transfer rate was inferior even if the heating temperature at the wafer side was relatively high.

Third Embodiment in this embodiment, transfer substrates were prepared while changing the configuration of the metal powder (metal paste) constituting the metal wiring material on the transfer substrate, the underlying metal film and the coating layer, and a metal wiring was formed on a Si wafer by using the respective transfer substrates. For conditions for preparing the transfer substrates, except the metal powders and the target materials for forming underlying metal (in the case of an underlying metal film composed of an alloy, an alloy target having the same composition was used) the process was basically the same as in the first embodiment. For the formation of the coating layer, after the application and the drying of metal paste in the process of the first embodiment, a coating layer was formed on the metal paste, and subsequently the resist was removed and the metal powder was sintered. For the formation of the coating layer by a plating method, film forming was carried out by using an appropriate commercially available plating solution in recommended conditions. Alternatively the coating layer can be formed by a sputtering method also by using a commercially available sputtering target material. The structure of the transfer substrates prepared is as follows.

TABLE 3

| Sample No. | Metal wiring material Metal powder | Metal wiring material Average particle size (μm) | Underlying metal film Material | Underlying metal film Film thickness (nm) | Coating layer Material | Coating layer Film thickness (μm) |
|---|---|---|---|---|---|---|
| 20 | Au | 0.01 | Pt | 1 | Ag (1) | 0.1 |
| 21 | | 0.3 | | 20 | | |
| 22 | | 1 | | 100 | | |
| 23 | Ag | 0.3 | Pt | 20 | Au | 0.1 |
| 24 | Pd | | | | | |
| 25 | Pt | | Au | 20 | | |
| 26 | Au | 0.3 | Au | 20 | Ag (1) | 0.1 |
| 27 | | | Ti | | | |
| 28 | | | Ru | | | |
| 29 | | | Pd | | | |
| 30 | | | Cr | | | |
| 31 | | | Ta | | | |
| 32 | | | Ir | | | |
| 33 | | | Au/Cr | | | |
| 34 | | | Au/Ti | | | |
| 35 | | | Pt—0.1% Zr | | | |
| 36 | | | Au—0.1% Zr | | | |
| 37 | | | Pt | | | |
| 38 | | 1.2 | Pt | | | |
| 39 | Au | 0.3 | Ti | 50 | Ag (2) | 0.01 |
| 40 | | | | | | 0.1 |
| 41 | | | | | Ag (1) | 0.01 |
| 42 | | | | | | 0.1 |
| 43 | | | | | | 1.0 |
| 44 | | | | | | 1.1 |
| 45 | | | | | Pt | 0.01 |
| 46 | | | | | | 0.1 |
| 47 | | | | | | 1.0 |
| 48 | | | | | | 1.1 |

TABLE 3-continued

| Sample No. | Metal wiring material | | | Coating layer | |
|---|---|---|---|---|---|
| | Metal powder | Average particle size (μm) | Underlying metal film | | |
| | | | Material | Film thickness (nm) | Material | Film thickness (μm) |
| 49 | | | | | Ag/Pt | 0.05/0.05 |
| 50 | | | | | Cr/Pt | 0.05/0.05 |
| 51 | | | | | Ti/Pt | 0.05/0.05 |

All substrates were glass substrates
Sample No. 21 is the same as the first embodiment
For Samples Nos. 33 and 34, a multilayer film (Au/Cr, Au/Ti) was formed and then heated at 250° C. in air for 1 hour to diffuse Cr or Ti into the Au surface and the surface was oxidized in air.
For Pt -0.1% Zr and Au - 0.1% Zr, a single layer film was formed by using an alloy target
Coating layer: Ag(1): electroless plating, Ag(2): electroplating
Coating layers of Au and Pt were formed by electroplating
For Samples No. 49 to 51, a multilayer coating layer was formed (metal wiring material/Pt/(Ag, Cr, Ti))

Figure 2:
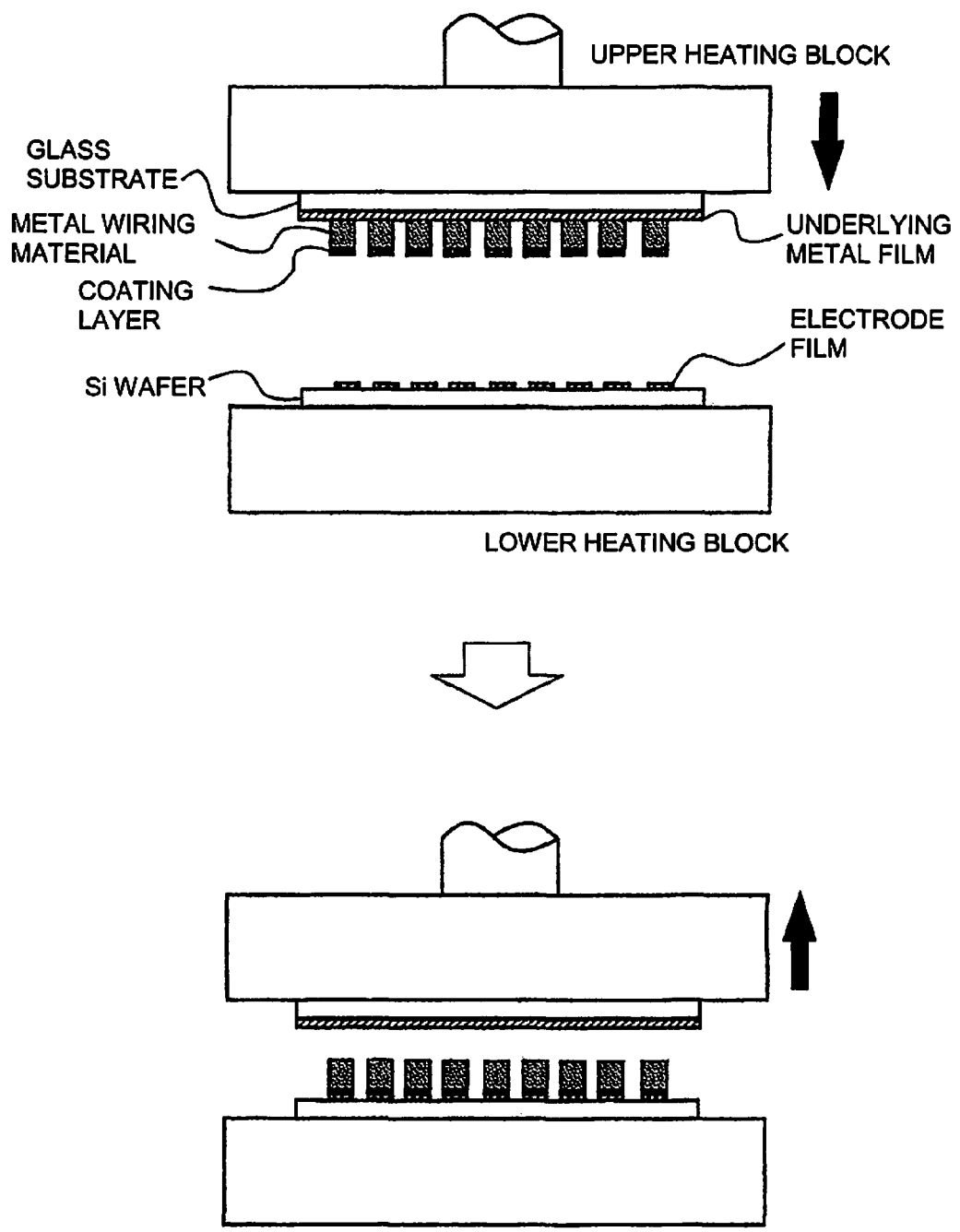
FIG. 2 is a schematic view illustrating the process for forming a metal wiring according to the third embodiment.

A metal wiring was formed on a Si wafer by use of the respective transfer substrates above. In these tests, the metal film on the Si wafer was changed in some cases. Also the temperature for heating the lower block was changed in some cases. FIG. 2 is a view illustrating the process. The results of the test are shown in Table 4.

Table 4 above shows that both when the metal wiring material was composed of varying types of metal powder and when the underlying metal film was changed, the transfer was perfect even at a low temperature of 300° C. or less. However, although low temperature is applicable, the transfer rate is likely to be decreased when the heating temperature at the wafer side is low (Sample No. 48).

Also, it has been found that when a metal powder having a large particle size was used (Test No. 49), the transfer rate was inferior even if the heating temperature at the wafer side was relatively high. Further, for the coating layer, in the case of the coating layers having a thickness of more than 1 μm, the transfer rate is found to be decreased (Test Nos. 50, 51).

Fourth Embodiment in this embodiment, a bump was formed in the same manner as in the second embodiment by use of Samples No. 39 to 51 of the third embodiment, and the shear strength (bonding force) of the bump was measured. In this embodiment, two different pressures (1 MPa, 5 MPa) were set. The shear strength was measured with a bonding tester. The results are shown in Table 5.

TABLE 4

| Test No. | Sample No. | Transfer substrate | | | Wafer Outermost surface of electrode film | Transfer conditions Wafer temperature/ pressure | Results of transfer test | |
|---|---|---|---|---|---|---|---|---|
| | | Wiring material | Underlying metal film | Coating layer | | | Transfer rate | Variation |
| 20 | 20 | Au | Pt | Ag (1) | Au | 80° C./1.5 | 100/100 | ±0.5 |
| 21 | 21 | | | | | 150° C./1.0 | 100/100 | ±0.5 |
| 22 | 22 | | | | | 300° C./0.1 | 100/100 | ±0.5 |
| 23 | 23 | Ag | Pt | Au | Ag | 150° C./1.0 | 100/100 | ±0.5 |
| 24 | 24 | Pd | Pt | | Pd | 250° C./1.0 | 100/100 | ±0.5 |
| 25 | 25 | Pt | Au | | Pt | 250° C./1.0 | 100/100 | ±0.5 |
| 26 | 26 | Au | Au | Ag (1) | Au | 150° C./1.0 | 100/100 | ±0.5 |
| 27 | 27 | | Ti | | | | 100/100 | ±0.5 |
| 28 | 28 | | Ru | | | | 100/100 | ±0.5 |
| 29 | 29 | | Pd | | | | 100/100 | ±0.5 |
| 30 | 30 | | Cr | | | | 100/100 | ±0.5 |
| 31 | 31 | | Ta | | | | 100/100 | ±0.5 |
| 32 | 32 | | Ir | | | | 100/100 | ±0.5 |
| 33 | 33 | | Au/Cr | | | | 100/100 | ±0.5 |
| 34 | 34 | | Au/Ti | | | | 100/100 | ±0.5 |
| 35 | 35 | | Pt—Zr | | | | 100/100 | ±0.5 |
| 36 | 36 | | Au—Zr | | | | 100/100 | ±0.5 |
| 37 | 39 | Au | Ti | Ag (2) | Au | 200° C./1.0 | 100/100 | ±0.5 |
| 38 | 40 | | | | | | 100/100 | ±0.5 |
| 39 | 41 | | | Ag (1) | | | 100/100 | ±0.5 |
| 40 | 42 | | | | | | 100/100 | ±0.5 |
| 41 | 43 | | | | | | 100/100 | ±0.5 |
| 42 | 45 | | | Pt (2) | | | 100/100 | ±0.5 |
| 43 | 46 | | | | | | 100/100 | ±0.5 |
| 44 | 47 | | | | | | 100/100 | ±0.5 |
| 45 | 49 | | | Ag/Pt | | | 100/100 | ±0.5 |
| 46 | 50 | | | Cr/Pt | | | 100/100 | ±0.5 |
| 47 | 51 | | | Ti/Pt | | | 100/100 | ±0.5 |
| 48 | 37 | Au | Pt | Ag (1) | Au | 70° C./1.5 | 80/100 | ±0.5 or more |
| 49 | 38 | | | | | 300° C./1.5 | 90/100 | ±0.5 or more |
| 50 | 44 | | | Ag (1) (1.1 μm) | | 200° C./1.0 | 80/100 | ±0.5 or more |
| 51 | 48 | | | Pt (1.1 μm) | | | 70/100 | ±0.5 or more |

TABLE 5

| | | Transfer substrate | | | Shear strength (MPa) | |
|---|---|---|---|---|---|---|
| Test No. | Sample No. | Wiring material | Underlying metal film | Coating layer | Pressing load 1 MPa | Pressing load 5 MPa |
| 1 | 39 | Au | Ti | Ag (2) | 30 | 31 |
| 2 | 40 | | | | 29 | 30 |
| 3 | 41 | | | Ag (1) | 32 | 35 |
| 4 | 42 | | | | 32 | 34 |
| 5 | 43 | | | | 22 | 28 |
| 6 | 44 | | | | 14 | 18 |
| 7 | 45 | | | Pt | 32 | 33 |
| 8 | 46 | | | | 28 | 29 |
| 9 | 47 | | | | 21 | 23 |
| 10 | 48 | | | | 15 | 17 |
| 11 | 49 | | | Ag/Pt | 32 | 34 |
| 12 | 50 | | | Cr/Pt | 24 | 25 |
| 13 | 51 | | | Ti/Pt | 25 | 26 |

Table 5 shows that taking into account the yield strength (21 MPa) of a gold powder sintered body, in the case of the coating layers having a thickness of more than 1 μm ((Test No. 6 (Sample No. 44) and (Test No. 10 (Sample No. 48)), the strength of the sample was insufficient with a shear strength of less than 20 MPa. All samples having a coating layer thickness of 1 μm or less had good strength. This is because as described above, the condition of the surface of the metal wiring material could not be maintained with a thick coating layer and thus bonding properties of the sintered body were decreased.

INDUSTRIAL APPLICABILITY

The present invention can provide a method of forming a metal wiring on a transfer-receiving object such as a semiconductor wafer, a compound wafer or an MEMS wafer at a lower temperature than before, and thus can contribute to miniaturization of metal wiring and preservation of the quality.

What is claimed is:

1. A method of forming a metal wiring, comprising superimposing a transfer substrate for transferring a metal wiring material to a transfer-receiving object, the transfer substrate comprising a substrate, at least one metal wiring material formed on the substrate and an underlying metal film formed between the substrate and the metal wiring material, on a transfer-receiving object on the transfer substrate opposed to the transfer-receiving object, and while heating the transfer substrate and the transfer-receiving object, pressing the transfer substrate, thereby bonding and transferring a metal wiring material to the transfer-receiving object,
wherein the metal wiring material of the transfer substrate is a molded article formed through sintering a powder consisting of at least one metal powder having a purity of 99.9% by weight or more and an average particle size of 0.01 μm to 1.0 μm, selected from gold powder, platinum powder, palladium powder and copper powder,
the underlying metal film of the transfer substrate is composed of any metal of gold, silver, platinum, palladium, ruthenium, rhodium, iridium, chromium, titanium, tungsten, tantalum, nickel, copper and zirconium, or an alloy thereof, and
the transfer substrate is heated at 80 to 200° C. and the transfer-receiving object is heated at 80 to 300° C.

2. The method of forming a metal wiring according to claim 1, further comprising at least one coating layer formed on a surface of the metal wiring material, wherein the coating layer is composed of any metal of gold, silver, platinum, palladium, ruthenium, rhodium, iridium, chromium, titanium, tungsten, tantalum, nickel, copper and zirconium, or an alloy thereof, and the coating layer is composed of a metal or an alloy having a composition different from that of the metal wiring material, and the coating layer has a total thickness of 1 μm or less.

3. The method of forming a metal wiring according to claim 2, wherein the underlying metal film is composed of a metal or an alloy having a composition different from that of the metal wiring material.

4. The method of forming a metal wiring according to claim 3, wherein the underlying metal film has a thickness of 1 to 100 nm.

5. The method of forming a metal wiring according to claim 2, wherein the underlying metal film has a thickness of 1 to 100 nm.

6. The method of forming a metal wiring according to claim 1, wherein the underlying metal film is composed of a metal or an alloy having a composition different from that of the metal wiring material.

7. The method of forming a metal wiring according to claim 6, wherein the underlying metal film has a thickness of 1 to 100 nm.

8. The method of forming a metal wiring according to claim 1, wherein the underlying metal film has a thickness of 1 to 100 nm.

9. The method of forming a metal wiring according to claim 1, wherein the pressure for pressing the transfer substrate is 0.1 to 1.5 times a yield strength of the metal wiring material.

10. The method of forming a metal wiring according to claim 1, further comprising forming, on the transfer-receiving object, an electrode film composed of a metal containing a metal constituting the metal wiring material on the transfer substrate.

11. The method of forming a metal wiring according to claim 1, wherein the metal wiring material on the transfer substrate is prepared by applying and sintering a metal paste composed of at least one metal powder having a purity of 99.9% by weight or more and an average particle size of 0.01 μm to 1.0 μm, selected from gold powder, silver powder, platinum powder, palladium powder and copper powder, and an organic solvent.

12. The method of forming a metal wiring according to claim 1, wherein the pressure for pressing the transfer substrate is 0.1 to 1.5 times a yield strength of the metal wiring material.

* * * * *